United States Patent
Oda et al.

(10) Patent No.: US 6,194,316 B1
(45) Date of Patent: Feb. 27, 2001

(54) METHOD FOR FORMING CU-THIN FILM

(75) Inventors: Masaaki Oda, Chiba-ken; Nobuya Imazeki, Ibaraki-ken; Hiroyuki Yamakawa, Ibaraki-ken; Hirohiko Murakami, Ibaraki-ken, all of (JP)

(73) Assignees: Vacuum Metallurgical Co., Ltd., Sanbumachi; Nihon Shinku Gijutsu Kabushiki Kaisha, Chigasaki, both of (JP)

( * ) Notice: Subject to any disclaimer, the term of this patent is extended or adjusted under 35 U.S.C. 154(b) by 0 days.

(21) Appl. No.: 09/368,901

(22) Filed: Aug. 6, 1999

(30) Foreign Application Priority Data

Aug. 10, 1998 (JP) .................................................. 10-226140

(51) Int. Cl.⁷ .................................................. H01L 21/44
(52) U.S. Cl. .......................... 438/687; 438/626; 438/627; 438/653; 438/654; 438/660; 438/668
(58) Field of Search .................................. 438/687, 626, 438/627, 628, 629, 631, 633, 638, 643, 644, 645, 653, 654, 660, 668, 672, 675, 679

(56) References Cited

U.S. PATENT DOCUMENTS

| | | | |
|---|---|---|---|
| 5,296,189 | * | 3/1994 | Kang et al. .............................. 419/9 |
| 5,587,111 | * | 12/1996 | Watanabe et al. .................. 252/514 |
| 5,750,194 | * | 5/1998 | Watanabe et al. .................... 427/216 |
| 5,953,629 | * | 9/1999 | Imazeki et al. ...................... 438/679 |
| 5,966,580 | * | 10/1999 | Watanabe et al. ....................... 419/9 |
| 6,001,730 | * | 12/1999 | Farkas et al. ......................... 438/627 |

FOREIGN PATENT DOCUMENTS 4-210481   7/1992   (JP) .
9-134891   5/1997   (JP) .

* cited by examiner

*Primary Examiner*—John F. Niebling
*Assistant Examiner*—Lynne Gurley
(74) *Attorney, Agent, or Firm*—Arent Fox Kintner Plotkin & Kahn, PLLC

(57) ABSTRACT

A method for forming a Cu-thin film includes the steps of coating a dispersion containing Cu-containing ultrafine particles individually dispersed therein on a semiconductor substrate having recessed portions, such as wiring grooves, via holes or contact holes, which have an aspect ratio ranging from 1 to 30; firing the coated semiconductor substrate in an atmosphere which can decompose organic substances present in the dispersion, but never oxidizes Cu to form a Cu-thin film on the substrate; then removing the Cu-thin film on the substrate except for that present in the recessed portions to thus level the surface of the substrate and to form the Cu-thin film in the recessed portions. The method permits the complete embedding or filling of the recessed portions of LSI substrates having a high aspect ratio with a Cu-thin film and thus permits the formation of a conductive, uniform and fine pattern, and further requires a low processing cost.

10 Claims, No Drawings

METHOD FOR FORMING CU-THIN FILM

BACKGROUND OF THE INVENTION

1. Field of the Invention

The present invention relates to a method for forming a Cu-thin film on a semiconductor substrate such as an LSI substrate and more particularly to a method for forming a Cu-thin film on a semiconductor substrate using a dispersion containing Cu ultrafine particles individually dispersed therein.

2. Prior Art

In the recent semiconductor industries, the distributing wires formed on a substrate have been increasingly finer and the number of layers formed thereon has also been increased in proportion to the requirements for LSI's having a higher integration density and ability of operating at a high speed. However, this results in a decrease in the pitch of wires and in turn impairs the capacity between neighboring wires and the resistance of the wires and a problem accordingly arises such as delayed signal transmission. To eliminate this problem, it has been required to use a wiring material having a low specific resistance and an interlayer insulating film having a low dielectric constant. For this reason, attempts have been made to use, as a material for distributing wires, Cu having a low specific resistance and excellent resistance to electromigration (EM) in place of Al alloys or the like conventionally used. As a method for forming a Cu-thin film, there has been developed a so-called damascene method which comprises the steps of depositing a Cu film in, for instance, wiring grooves, via holes and contact holes according to, for instance, the sputtering method, CVD method or plating method and then subjecting the Cu film to a chemical-mechanical polishing (CMP) treatment.

However, such a conventional Cu-thin film-forming method suffers from the following problems. In the sputtering method among the methods for depositing Cu-thin films on a substrate, there is in general a limit in the degree of step coverage and further the reflow temperature should be reduced in order to ensure the compatibility with the method to the formation of a low dielectric film, even when the sputtering method is used in combination with the reflow method. For this reason, it is difficult to accelerate the embedding or filling up of fine grooves through reflow. Additionally, this method also suffers from a problem in that it requires a high processing cost. On the other hand, the plating method requires the formation of a Cu-thin film, as the so-called seed layer, on a barrier layer and this in turn results in such a problem that the plating liquid remains in voids. Both of the foregoing film-forming methods are insufficient for the method for forming the Cu-thin film. In addition, these methods are insufficient in the ability to embed or fill up, for instance, grooves for distributing wires when the aspect ratio of the grooves or the like is high.

SUMMARY OF THE INVENTION

The present invention has been developed for solving the foregoing problems associated with the conventional techniques and it is accordingly an object of the present invention to provide a method for forming a Cu-thin film which can embed or fill up recessed portions, with Cu metal, on a semiconductor substrate possessing such recessed portions as wiring grooves, via holes and contact holes which have a high aspect ratio, without forming any void therein and which requires a low processing cost.

The foregoing object of the present invention can effectively be accomplished by providing a method for forming a Cu-thin film which comprises the steps of coating a dispersion containing Cu ultrafine particles individually dispersed therein (hereinafter simply referred to as "individual Cu ultrafine particle dispersion") on a semiconductor substrate having recessed portions such as wiring grooves, via holes and contact holes, having an aspect ratio ranging from 1 to 30; firing the coated semiconductor substrate in an atmosphere which can decompose organic substances present in the dispersion, but never oxidizes Cu to form a Cu-thin film on the substrate; then removing the Cu film on the substrate except for that present in the recessed portions to thus level the surface of the substrate and to form Cu-thin film in the recessed portions.

The firing step is desirably carried out in vacuum or desirably at a pressure of not more than $10^{-2}$ Torr, in the presence of an extremely small amount of $O_2$ or $H_2O$ or $CO_2$. Moreover, the firing step is carried out at a temperature ranging from 150 to 500° C. for a time preferably ranging from 10 minutes to one hour. With regard to the firing temperature, if it is less than 150° C., the Cu-thin film is not sufficiently dried because of insufficient removal of the dispersion medium of the dispersion, while if it exceeds 500° C., the semiconductor element would thermally be damaged. The crystallization of the Cu metal thin film and the adhesion of the metal thin film to the inner walls of the recessed portions can be accelerated or improved if the coated substrate is heated in an atmosphere identical to that used in the firing step at a temperature ranging from 300 to 500° C. for a period of time preferably ranging from 15 to 30 minutes, after the foregoing firing step. Regarding the heating temperature, if it is less than 300° C., the metal thin film is insufficiently crystallized, while if it exceeds 500° C., the semiconductor element would thermally be damaged. In this connection, the method for coating the foregoing dispersion is not restricted to any specific one and may be a commonly used coating method such as a spin coating, dip coating or spray coating method. In addition, the foregoing leveling step is carried out by, for instance, the damascene method which makes use of the so-called CMP treatment.

The Cu-thin film-forming method according to the present invention may include a pre-treatment comprising the steps of, for instance, forming a barrier film of TiN, Ta, TaN, WN or the like on the surface of the substrate including the inner walls of the recessed portions such as wiring grooves, via holes and contact holes through a sputtering method such as a directional sputtering method or a CVD method and then forming a seed film of Cu thereon by a sputtering method such as a directional sputtering method or a CVD method.

The individual Cu ultrafine particle dispersion, which may be used in the Cu wire-forming method of the present invention comprises, for instance, an organic solvent which can be evaporated during the drying-firing step upon forming Cu-distributing wires on a semiconductor substrate, preferably an organic solvent capable of being evaporated at a temperature of not less than 150° C.; and metal Cu-containing ultrafine particles having a particle size of not more than 0.01 μm mixed with or dispersed in the organic solvent. In this dispersion, the metal Cu ultrafine particles are dispersed in the organic solvent while individually surrounded by or covered with the organic solvent and the dispersion has a viscosity of not more than 100 cP as determined at a temperature of 20° C.

Examples of such organic solvents preferably used in the present invention include α-terpineol, mineral spirits, tridecane, dodecylbenzene or mixtures thereof. In addition, examples of the foregoing metal Cu-containing ultrafine particles usable herein are those comprising metal Cu particles, CuO particles or a mixture of Cu and CuO particles. The concentration of the metal Cu-containing ultrafine particles in the dispersion in general ranges from 5 to 70% by weight and preferably 15 to 50% by weight on the basis of the total weight of the dispersion. If the concentration of the particles exceeds 50%, the viscosity becomes too high, and if the concentration of the particles is less than 15%, the film thickness is too small. The metal Cu-containing ultrafine particles may comprise, in addition to Cu metal, at least one metal or metal-containing compound whose solubility in Cu is low and which is susceptible to the reaction with the basic material for a semiconductor substrate and thus, the adhesion thereof to the basic material may be substantially improved. Specific examples of such metals or metal compounds other than elemental Cu include Mg, Al, B, Ta, Nb, V and compounds containing these metals. The compounds of these metals includes, for instance, $(C_{17}H_{35}COO)_2Mg$, $(C_{17}H_{35}COO)_3Al$ and the like. The amount of these metals or compounds to be added to the Cu ultrafine particles preferably ranges from 0.5 to 5 wt% on the basis of the total weight of the ultrafine particles. If the individual Cu ultrafine particle dispersion has a viscosity of not more than 100 cP and preferably not more than 10 cP as determined at 20° C., the metal Cu-containing ultrafine particles can enter, without any problems, into the recessed portions such as wiring grooves, via holes and contact holes formed on a semiconductor substrate having a high aspect ratio ranging from 1 to 30, while the ultrafine particles are individually dispersed in the dispersion, and can completely embed or fill up these recessed portions to permit the formation of an even liquid film on the surface of the substrate. Thereafter, if the liquid film is heated in a desired atmosphere at a predetermined temperature over a desired period of time, the dispersion medium of the dispersion is evaporated off, the metal ultrafine particles of, for instance, Cu are fused together and can embed or fill up the recessed portions without forming any void to thus form a metal thin film on the semiconductor substrate. In addition, the Cu-thin film-forming method using such a dispersion permits the effective use of the metal material without any waste. In this method, a vacuum device may be used, but the use thereof is not fundamentally required.

DETAILED DESCRIPTION OF THE PREFERRED EMBODIMENTS

The method for forming a Cu-thin film according to the present invention will hereinafter be described in more detail with reference to the following working Examples, but the present invention is not restricted to these specific Examples at all.

EXAMPLE 1

An individual Cu ultrafine particle dispersion containing 20% by weight of Cu ultrafine particles having an average particle size of 0.008 $\mu$m was prepared by the gas phase evaporation method, i.e., by evaporating metal Cu under such a condition as 0.5 Torr of helium vapor, forming the Cu ultrafine particles in contact with the vapor of α-terpineol and then cooling and recovering the resulting ultrafine particles in the form of a dispersion in which the Cu ultrafine particles were individually dispersed in the α-terpineol solvent. The viscosity of the resulting dispersion was determined and found to be 100 cP at room temperature and 3 cP at 150° C.

Then via holes formed on the surface of an Si substrate were treated with the individual Cu ultrafine particle dispersion thus prepared. In this regard, the Si substrate was provided with an $SiO_2$ film as an insulating film through which via holes having a diameter of 0.15 $\mu$m (aspect ratio: 5) and a diameter of 0.25 $\mu$m (aspect ratio: 4) had been formed. Moreover, a barrier film of WN having a thickness of 0.02 $\mu$m was formed on the surface of the Si substrate including the inner walls of the via holes by sputtering and a seed film of Cu was formed on the surface of the barrier film.

Then the substrate thus treated was mounted on a spin coater, followed by rotating the coater at a rate of 500 rpm and then dropwise addition of the heated individual Cu ultrafine particle dispersion from the top of the coater to thus subject the substrate to spin coating. The via holes were filled with the dispersion by spin-coating the substrate with the dispersion heated to a temperature of not less than 50° C. and accordingly, an even liquid film of the dispersion was formed on the surface of the substrate. The substrate provided thereon with the liquid film was heated to a temperature of 250° C. in a vacuum of not higher than $10^{-2}$ Torr for 2 minutes to thus remove the organic solvent and then fired in a vacuum atmosphere in the presence of oxygen gas (oxygen partial pressure: $10^{-9}$ Torr) for 60 minutes while raising the temperature to 300° C. Moreover, the substrate was fired in an inert gas free of any oxygen for 30 minutes while raising the temperature up to 400° C. Thus, a Cu-thin film was formed through mutual fusion of Cu ultrafine particles, which in turn embedded or filled up the via holes without forming any void and the resulting Cu-thin film was free of any shrinkage and crack. Then the Cu-thin film except for that present within the via holes was subjected to the CMP treatment to remove the excess Cu present on the surface of the substrate. Thus, a Cu-thin film having an even surface was formed within the via holes. The specific resistance of the film thus formed was determined and was found to be 2.0 $\mu\Omega$·cm.

EXAMPLE 2

An individual CuO ultrafine particle dispersion (particle size of the CuO ultrafine particles was found to be 0.01 $\mu$m) was prepared by evaporating Cu in a helium gas atmosphere to which $O_2$ gas was added at a pressure of 0.01 Torr, while using mineral spirit as an organic solvent, as a substitute for the individual Cu ultrafine particle dispersion used in Example 1. The viscosity of the resulting dispersion was found to be 5 cP at 20° C.

Then the same procedures used in Example 1 were repeated except that the dispersion was not heated to thus embed or fill up the via holes on a substrate and to form a Cu-thin film. The resulting thin film was found to be free of any shrinkage and crack even after firing or sintering and the specific resistance thereof was found to be 2.0 $\mu\Omega$·cm.

EXAMPLE 3

The same procedures used in Example 1 were repeated except that tridecane was used as the organic solvent to give an individual Cu ultrafine particle dispersion as a substitute for that used in Example 1. To the resulting dispersion, there was added an organic compound of Mg, Al, B, Ta, Nb or V. All of the dispersions thus obtained were found to have a viscosity equal to 10 cP at 20° C.

Then the same procedures used in Example 1 were likewise repeated except for the processes for forming the WN barrier film and the Cu seed film, using these dispersions to thus embed or fill up the via holes of substrates and to form Cu-thin films. As a result, it was found that each resulting thin film did not cause any shrinkage and crack even after the firing or sintering step and during the leveling treatment by the CMP method and that the thin film was excellent in the adhesion to the substrate. In addition, the specific resistance of the thin film was found to be 2.0 $\mu\Omega\cdot$cm.

EXAMPLE 4

A mixed dispersion having a viscosity of 50 cP as determined at 20° C. was prepared by blending the individual Cu ultrafine particle dispersion prepared in Example 1 and the individual CuO ultrafine particle dispersion prepared in Example 2 and then a wiring pattern was formed on an Si substrate using the resulting mixed dispersion. In this respect, the Si substrate was provided thereon with an $SiO_2$ film as an insulating film on which a groove having a width of 0.25 $\mu$m and a depth of 1 $\mu$m (aspect ratio: 4) was formed in the form of a pattern. Moreover a WN barrier film having a thickness of 0.02 $\mu$m was formed on the surface of the substrate including the inner walls of the groove through sputtering and a Cu seed film was also formed on the surface of the barrier film through sputtering.

Then the substrate thus treated was mounted on a spin coater, followed by rotating the coater at a rate of 500 rpm and then dropwise addition of the mixed individual Cu ultrafine particle dispersion from the top of the coater to thus subject the substrate to spin coating. The patterned groove was filled with the dispersion through the spin-coating treatment and accordingly, an even liquid film of the dispersion was formed on the surface of the substrate. The substrate provided thereon with the liquid film was heated to a temperature of 250° C. in a vacuum of not higher than $10^{-2}$ Torr for 2 minutes to evaporate the organic solvent and then fired in an inert gas atmosphere in the presence of $H_2O$ gas ($H_2O$ partial pressure: 10 Torr) for 60 minutes while raising the temperature to 300° C. Moreover, the substrate was fired in an inert gas atmosphere free of any $H_2O$ gas for 30 minutes while raising the temperature up to 400° C. to thus form a Cu-thin film through mutual fusion of Cu ultrafine particles. The Cu-thin film embedded or filled up the grooves without forming any void and the resulting Cu-thin film was free of any shrinkage and crack. Then the Cu-thin film except for that present within the groove was subjected to the CMP treatment to remove the excess Cu present on the surface of the substrate. Thus, a Cu-thin film having an even surface was formed. The specific resistance of the film thus formed was determined and was found to be 2.0 $\mu\Omega\cdot$cm.

EXAMPLE 5

The same procedures used in Example 4 were repeated except that $CO_2$ gas of 760 Torr was substituted for the $H_2O$ gas used in the firing step of Example 4 to thus form a Cu-thin film. The specific resistance of the film thus formed was found to be 2.0 $\mu\Omega\cdot$cm.

As has been described above in detail, the Cu-thin film-forming method according to the present invention permits the complete embedding or filling of, for instance, fine wiring grooves, via holes and contact holes of LSI substrates with a Cu-thin film and thus permits the formation of a conductive, uniform and fine pattern.

What is claimed is:

1. A method for forming a Cu-thin film, said method comprising the steps of:

coating a dispersion containing Cu-containing ultrafine particles individually dispersed in the dispersion on a semiconductor substrate having recessed portions of an aspect ratio ranging from 1 to 30 to form a coated semiconductor substrate; and then firing the coated semiconductor substrate in an atmosphere which can decompose organic substrates present in the dispersion, in a vacuum atmosphere in the presence of an extremely small amount of $O_2$ or an inert gas atmosphere in the presence of $H_2O$ or $CO_2$ at a temperature ranging from 150 to 500° C., to form a Cu-thin film on the substrate, wherein the firing step does not essentially oxidize Cu.

2. The method for forming a Cu-thin film as set forth in claim 1, wherein the firing step is performed in a vacuum atmosphere in the presence of an extremely small amount of $O_2$, said extremely small amount of $O_2$ yielding an oxygen partial pressure of no more than $10^{-9}$ Torr in said vacuum atmosphere.

3. The method for forming a Cu-thin film as set forth in claim 1, wherein after the firing step, the Cu-thin film on the substrate except for that present in the recessed portions is removed to thus level the surface of the substrate and to form the Cu-thin film in the recessed portions.

4. The method for forming a Cu-thin film as set forth in claim 1, wherein after the firing step, the fired substrate is heated to a temperature ranging from 300 to 500° C. in an inert atmosphere to accelerate or improve crystallization of the Cu-thin film and adhesion of the Cu-thin film to an inner wall of the recessed portions.

5. The method for forming a Cu-thin film as set forth in claim 2, wherein after the firing step, the fired substrate is heated to a temperature ranging from 300 to 500° C. in an inert atmosphere to accelerate or improve crystallization of the Cu-thin film and adhesion of the Cu-thin film to an inner wall of the recessed portions.

6. The method for forming a Cu-thin film as set forth in claim 1, wherein the method further comprises a pre-treatment comprising the steps of:

forming, by sputtering, a barrier film of TiN, Ta, TaN or WN on the surface of the semiconductor substrate and on an inner wall of the recessed portions; and then forming a seed film of Cu on the barrier film by sputtering.

7. The method for forming a Cu-thin film as set forth in claim 1 wherein the Cu-containing ultrafine particles are one member selected from the group consisting of metal Cu ultrafine particles, CuO ultrafine particles and a mixture of Cu and CuO ultrafine particles.

8. The method for forming a Cu-thin film as set forth in claim 1 wherein the concentration of the Cu-containing ultrafine particles in the dispersion ranges from 5 to 70% by weight on the basis of the total weight of the dispersion.

9. The method for forming a Cu-thin film as set forth in claim 8 wherein the concentration of the Cu-containing ultrafine particles in the dispersion ranges from 15 to 50% by weight on the basis of the total weight of the dispersion.

10. The method for forming a Cu-thin film as set forth in claim 1 wherein the Cu-containing ultrafine particles include, in addition to Cu, at least one member selected from the group consisting of Mg, Al, B, Ta, Nb, V and compounds of these metals.

* * * * *